United States Patent
Bostoen et al.

(10) Patent No.: US 7,167,555 B2
(45) Date of Patent: Jan. 23, 2007

(54) METHOD FOR MATCHING AN ADAPTIVE HYBRID TO A LINE

(75) Inventors: Tom Bostoen, Antwerp (BE); Thierry Pollet, Mechelen (BE); Patrick Jan Maria Boets, Heffen (BE); Leonard Pierre Van Biesen, Aalst (BE)

(73) Assignee: Alcatel, Paris (FR)

( * ) Notice: Subject to any disclaimer, the term of this patent is extended or adjusted under 35 U.S.C. 154(b) by 62 days.

(21) Appl. No.: 10/991,487

(22) Filed: Nov. 19, 2004

(65) Prior Publication Data
US 2005/0117738 A1 Jun. 2, 2005

(30) Foreign Application Priority Data
Nov. 20, 2003 (EP) ................................. 03292891

(51) Int. Cl.
*H04M 9/00* (2006.01)
(52) U.S. Cl. .................. 379/398; 379/399.01; 379/394
(58) Field of Classification Search ................ 379/398, 379/399.01, 394
See application file for complete search history.

(56) References Cited
U.S. PATENT DOCUMENTS
6,208,732 B1 3/2001 Moschytz et al.
6,724,890 B1 * 4/2004 Bareis ......................... 379/394

OTHER PUBLICATIONS
Arnaut L R: "Adaptive Control and Optimization of Electromagnetic Radiation, Attenuation, and Scattering Using Self-Adaptive Material Systems," IEEE Transactions on Antennas and Propagation, IEEE Inc. New York, US, vol. 51, No. 7, Jul. 2003, pp. 1530-1548, XP001170048.

* cited by examiner

*Primary Examiner*—Jefferey F. Harold
(74) *Attorney, Agent, or Firm*—Sughrue Mion, PLLC

(57) ABSTRACT

Methods for matching adaptive hybrids (15) to lines (16) for making reflectograms of the lines (16) measure (1) input impedances ($Z_{meas}$) of the lines (16), model (2) characteristic impedances of the lines (16) via physical models ($Z_{phymod}$), estimate (3) parameters of the physical models ($Z_{phymod}$) via cost functions which depend on the measured input impedances ($Z_{meas}$), convert (30) the modelled characteristic impedances into impedance values (13), and set (31) the adaptive hybrids (15) with the impedance values (13). Unwanted near-end reflections are minimised and wanted reflections can be measured. The physical models depend on frequencies s, Bessel functions $J_i$ and parameters $a_i$ related to geometrical dimensions A, D and L and material constants $\sigma$, $\epsilon$ and $\mu$ of the lines (16). The method may further model (6) characteristic impedances of the lines (16) via rational function models ($Z_{rafumod}$) and estimate (7) parameters of the rational function models ($Z_{rafumod}$) via further cost functions which depend on outcomes of the physical models ($Z_{phymod}$).

14 Claims, 2 Drawing Sheets

METHOD FOR MATCHING AN ADAPTIVE HYBRID TO A LINE

BACKGROUND OF THE INVENTION

The invention relates to a method for matching an adaptive hybrid to a line for making a reflectogram of the line.

A prior art method for matching an adaptive hybrid to a line is of common general knowledge. To be able to make a reflectogram, the hybrid must be properly matched to the line. Thereto, a characteristic impedance of the line is to be determined. When using the characteristic impedance of the line for matching the hybrid to the line, any unwanted near-end reflections will be minimized, and all other reflections can be determined well via the reflectogram. The characteristic impedance of the line is however unknown. An input impedance of the line can easily be measured, but when using the measured input impedance for matching the hybrid to the line, reflections can no longer be determined via the reflectogram, due to these reflections no longer occurring. Further, the characteristic impedance of the line sometimes differs a lot from the measured input impedance of the line. In that case, the measured input impedance is no indication for the characteristic impedance to be determined.

The known method is disadvantageous, inter alia, due to sometimes matching the hybrid relatively improperly to the line.

SUMMARY OF THE INVENTION

It is an object of the invention, inter alia, to provide a method which relatively properly matches the hybrid to the line.

The method according to the invention is characterised in that the method comprises the steps of measuring an input impedance of the line;

modeling a characteristic impedance of the line via a physical model;

estimating at least one parameter of the physical model via a cost function which depends on the measured input impedance;

converting the modeled characteristic impedance into at least one impedance value; and setting the adaptive hybrid with the at least one impedance value.

By applying one or more physical models for modeling the characteristic impedance of the line, by applying one or more cost functions for estimating one or more parameters of the modeling functions, by converting the modeled characteristic impedance into at least one impedance value and by setting the hybrid with this at least one impedance value, the hybrid is matched properly to the line. Unwanted near-end reflections will be minimized, and wanted reflections can be measured.

An embodiment of the method according to the invention is characterised in that the physical model depends on a frequency s, at least one Bessel function $J_i$ and at least three parameters $a_i$ related to geometrical dimensions and material constants of the line.

This physical model takes into account geometrical dimensions and material constants of the line and models the characteristic impedance in an improved way compared to modeling functions not taking into account geometrical dimensions and material constants of the line.

An embodiment of the method according to the invention is characterised in that the physical model $Z_{phymod} = [a_4 \ s^2 + a_1 \ s \ (-s)^{1/2} \ J_0/J_1 + a_1 \ a_3 \ s^2 \ \psi/2]^{1/2}/(a_5 \ s)$, wherein $\psi = (3 \ a_2^3 \ J_3 \ J_2 + 2 \ a_2 \ J_1 \ J_2 + a_2^2 \ J_0 \ J_3)/(a_2^3 \ J_2 \ J_3 + a_2 \ J_1 \ J_2 + 3 \ a_2^2 \ J_0 \ J_3 + J_0 \ J_1)$;

$J_i = J_i[a_3(-s)^{1/2}]$;

$a_1 = A^{-1} \cdot (\mu/\sigma)^{1/2} \ \epsilon \ L \ [arcosh(D/2A)]^{-1}$;

$a_2 = (A/D)^2$;

$a_3 = A \ (\mu \ \sigma)^{1/2}$;

$a_4 = a_1 \ a_3 \ [\ln (a_2)^{1/2}]^{-1}$;

$a_5 = \pi \ \epsilon \ L \ [arcosh(D/2A)]^{-1}$;

with A, D and L being geometrical dimensions and with $\sigma$, $\epsilon$ and $\mu$ being material constants of the line.

This physical model has proven to model the characteristic impedance extremely well.

An embodiment of the method according to the invention is characterised in that the cost function $C = \Sigma[|Z'_{phymod} - Z'_{meas}|^2/(Z'_{est-var})^2]$, wherein $Z'_{phymod}$ = a value of the modeled characteristic impedance per frequency component;

$Z'_{meas}$ = a value of the measured input impedance per frequency component;

$Z'_{est-var}$ = a value of an estimated variance per frequency component of the measured input impedance; and $\Sigma$ = a summing over a number of frequency components.

This cost function has proven to minimize the costs of the physical model extremely well.

An embodiment of the method according to the invention is characterised in that the method further comprises the further steps of modeling a characteristic impedance of the line via a rational function model; and estimating at least one parameter of the rational function model via a further cost function which depends on an outcome of the physical model;

which further steps are situated between the step of estimating and the step of converting.

By applying one or more rational function models for modeling the characteristic impedance of the line, by applying one or more further cost functions for estimating one or more parameters of the rational function models and by then converting the modeled characteristic impedance as modeled according to the rational function models into the at least one impedance value, the converting can be realized by means of an advantageous conversion, like a Foster circuit synthesis.

An embodiment of the method according to the invention is characterized in that the rational function model $Z_{rafumod} = (\Sigma c_i \ s^i)/(\Sigma d_i \ s^i)$, wherein $\Sigma c_i \ s^i$ = a summing from i=0 to i=n with $c_i$ being a parameter; and $\Sigma d_i \ s^i$ = a summing from i=0 to i=m with $d_i$ being a parameter.

This rational function has proven to further model the characteristic impedance well.

An embodiment of the method according to the invention is characterized in that the further cost function $FC = \Sigma[|Z'_{phymod} - Z'_{rafumod}|^2$, wherein $Z'_{phymod}$ = a value of the modeled characteristic impedance per frequency component in accordance with the physical model based on the at least one estimated parameter;

$Z'_{rafumod}$=a value of the modeled characteristic impedance per frequency component in accordance with the rational function model; and Σ=a summing over a number of frequency components.

This further cost function has proven to minimize the costs of the rational function model well.

The invention further relates to a processor program product for matching an adaptive hybrid to a line for making a reflectogram of the line.

The processor program product according to the invention is characterized in that the processor program product comprises the functions of measuring an input impedance of the line;
modeling a characteristic impedance of the line via a physical model;
estimating at least one parameter of the physical model via a cost function which depends on the measured input impedance;
converting the modeled characteristic impedance into at least one impedance value; and
setting the adaptive hybrid with the at least one impedance value.

Such a processor program product is stored in a memory or on a storage medium and is to be run via a processor.

The invention yet further relates to a processor-system for matching an adaptive hybrid to a line for making a reflectogram of the line.

The processor-system according to the invention is characterized in that the processor-system performs the functions of measuring an input impedance of the line;
modeling a characteristic impedance of the line via a physical model;
estimating at least one parameter of the physical model via a cost function which depends on the measured input impedance;
converting the modeled characteristic impedance into at least one impedance value; and
setting the adaptive hybrid with the at least one impedance value.

Such a processor-system for example comprises or is coupled to a memory or a storage medium comprising a processor program product.

The invention also relates to a network-unit comprising an adaptive hybrid and a processor-system for matching an adaptive hybrid to a line for making a reflectogram of the line.

The network-unit according to the invention is characterized in that the processor-system performs the functions of measuring an input impedance of the line;
modeling a characteristic impedance of the line via a physical model;
estimating at least one parameter of the physical model via a cost function which depends on the measured input impedance;
converting the modeled characteristic impedance into at least one impedance value; and
setting the adaptive hybrid with the at least one impedance value.

Such a network-unit for example corresponds with a Digital Subscriber Line Acces Multiplexer or with a switch, a router, a bridge, a modem system etc.

Embodiments of the processor program product according to the invention and of the processor-system according to the invention and of the network-unit according to the invention correspond with the embodiments of the method according to the invention.

The invention is based upon an insight, inter alia, that the characteristic impedance of the line may differ a lot from the measured input impedance of the line, and is based upon a basic idea, inter alia, that the characteristic impedance should be modeled.

The invention solves the problem, inter alia, to provide a method which properly matches the hybrid to the line, and is advantageous, inter alia, in that unwanted near-end reflections are minimized and that wanted reflections can be measured.

These and other aspects of the invention will be apparent from and elucidated with reference to the embodiments(s) described hereinafter.

DETAILED DESCRIPTION OF THE NON-LIMITING EMBODIMENTS

Figure 1:
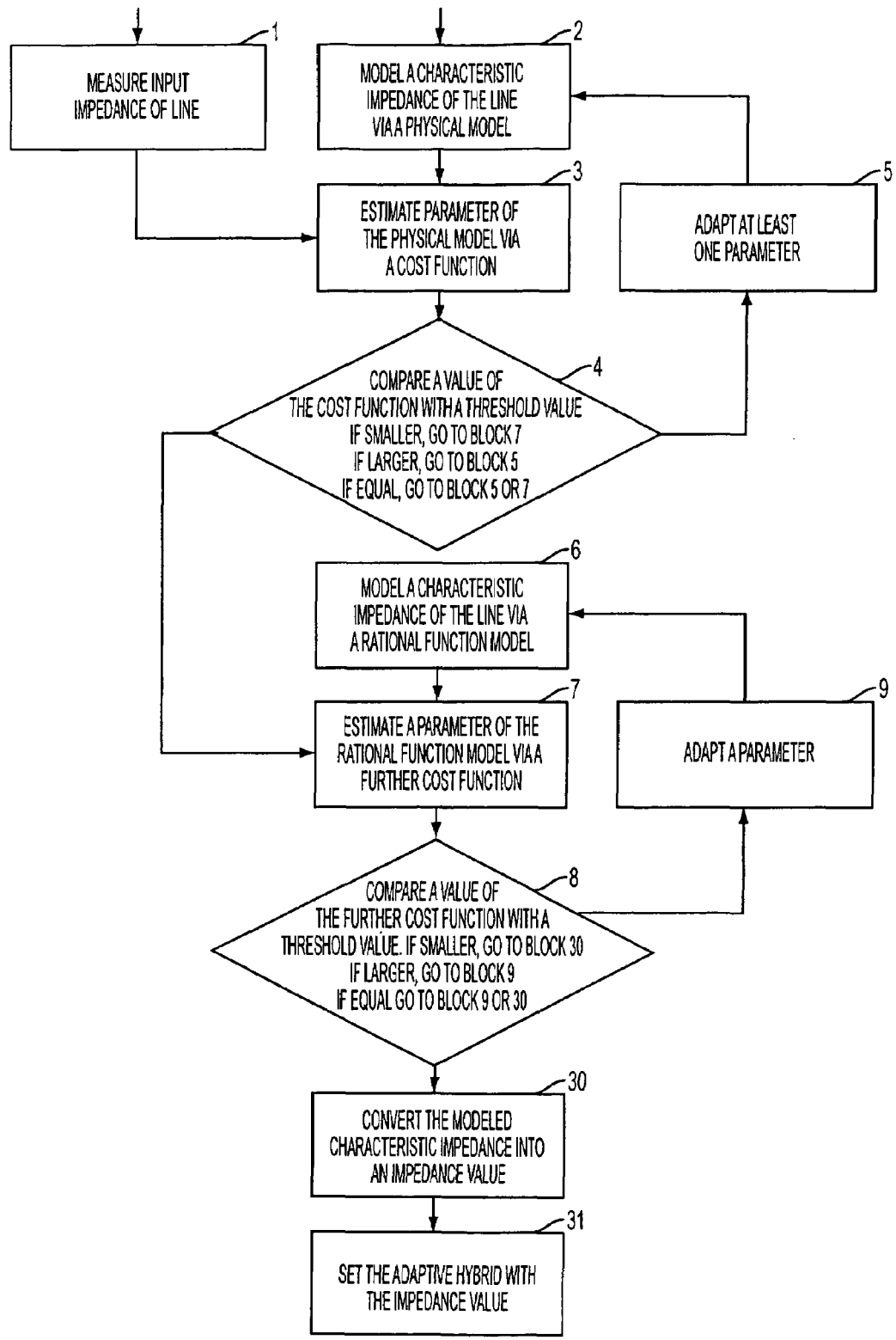
FIG. 1 shows in block diagram form a method according to the invention.

The method according to the invention as shown in FIG. 1 for matching an adaptive hybrid to a line for making a reflectogram of the line comprises steps indicated by blocks. These blocks have the following meaning:

Block 1: measuring an input impedance of the line, goto block 3;

Block 2: modeling a characteristic impedance of the line via a physical model, goto block 3;

Block 3: estimating at least one parameter of the physical model via a cost function which depends on the measured input impedance, goto block 4;

Block 4: comparing a value of the cost function with a threshold value: if smaller, goto block 7, if larger, goto block 5, if equal, goto either block 5 or block 7;

Block 5: adapting at least one parameter; goto block 2, thereby now using the at least one parameter having an adapted value;

Block 6: modeling a characteristic impedance of the line via a rational function model, goto block 7;

Block 7: estimating at least one parameter of the rational function model via a further cost function which depends on the outcome of the physical model, goto block 8;

Block 8: comparing a value of the further cost function with a threshold value: if smaller, goto block 30, if larger, goto block 9, if equal, goto either block 9 or block 30;

Block 9: adapting at least one parameter; goto block 6, thereby now using the at least one parameter having an adapted value;

Block 30: converting the modeled characteristic impedance into at least one impedance value, goto block 31.

Block 31: setting the adaptive hybrid with the at least one impedance value.

The method as shown in FIG. 1 functions as follows. The input impedance is measured (block 1, goto block 3). A characteristic impedance of the line is modeled via a physical model (block 2, goto block 3). At least one parameter of the physical model is estimated via a cost function which depends on the measured input impedance (block 3, goto block 4). A value of the cost function is compared with a threshold value (block 4, if smaller, goto block 7, if larger, goto block 5, if equal, goto either block 5 or block 7). If larger, at least one parameter is adapted (block 5, goto block 2), thereby now using the at least one parameter having an adapted value. If smaller, a characteristic impedance of the line is modeled via a rational function model (block 6, goto block 7). At least one parameter of the rational function model is estimated via a further cost function which depends on the outcome of the physical model (block 7, goto block 8). A value of the further cost function is compared with a threshold value (block 8, if smaller, goto block 30, if larger, goto block 9, if equal, goto either block 9 or block 30). If larger, at least one parameter is adapted (block 9, goto block 6), thereby now using the at least one parameter having an adapted value. If smaller, the modeled characteristic impedance is converted into at least one impedance value (block 30) and the adaptive hybrid is set with the at least one impedance value (block 31). This converting is a prior art conversion common in the art and for example disclosed in "Analog and digital filter: design and realization", 1979, Prentice Hall, chapter 6. As a result, the adaptive hybrid is provided with an estimated and modeled characteristic impedance, and the hybrid is matched properly to the line (minimized unwanted near-end reflections).

Preferably, the physical model depends on a frequency s, at least one Bessel function $J_i$ and at least three parameters $a_i$ related to geometrical dimensions and material constants of the line.

Such a physical model $Z_{mod}$ can for example be expressed as $Z_{mod} = [a_4 s^2 + a_1 s (-s)^{1/2} J_0/J_1 + a_1 a_3 s^2 \psi/2]^{1/2}/(a_5 s)$, wherein
$\psi = (3 a_2^3 J_3 J_2 + 2 a_2 J_1 J_2 + a_2^2 J_0 J_3)/(a_2^3 J_2 J_3 + a_2 J_1 J_2 + 3 a_2^2 J_0 J_3 + J_0 J_1)$
$J_i = J_i [a_3 (-s)^{1/2}]$;
$a_1 = A^{-1} (\mu/\sigma)^{1/2} \epsilon L [\text{arcosh}(D/2A)]^{-1}$;
$a_2 = (A/D)^2$;
$a_3 = A (\mu \sigma)^{1/2}$;
$a_4 = a_1 a_3 [\ln (a_2)^{-1/2}]^{-1}$;
$a_5 = \pi \epsilon L [\text{arcosh}(D/2A)]^{-1}$;

with A, D and L being geometrical dimensions and with $\sigma$, $\epsilon$ and $\mu$ being material constants of the line. Of course, many alternative functions will be possible without departing from the scope of this invention. A is the radius of each conductor of a parallel wire line used in a Digital Subscriber Line environment, D is the distance between the centers of these conductors, and L is the length of the line. The electrical permettivity of this line is indicated by $\epsilon$, the conductivity of this line by $\sigma$ and the magnetic permeability of this line is indicated by $\mu$. Of course, $s = j \omega$. Many alternative functions will be possible without departing from the scope of this invention.

Preferably, the cost function depends on a square of an absolute value of a difference between a value of a modeled characteristic impedance and a value of a measured input impedance.

Such a cost function C can for example be expressed as $C = \Sigma [|Z'_{phymod} - Z'_{meas}|^2 / (Z'_{est-var})^2]$, wherein
  $Z'_{phymod}$ = a value of the modeled characteristic impedance per frequency component;
  $Z'_{meas}$ = a value of the measured input impedance per frequency component;
  $Z'_{est-var}$ = a value of an estimated variance per frequency component of the measured input impedance; and
  $\Sigma$ = a summing over a number of frequency components. Of course, many alternative functions will be possible without departing from the scope of this invention.

The rational function model can for example be expressed as $Z_{rafumod} = (\Sigma c_i s^i)/(\Sigma d_i s^i)$, wherein
  $\Sigma c_i s^i$ = a summing from i=0 to i=n with $c_i$ being a parameter; and
  $\Sigma d_i s^i$ = a summing from i=0 to i=m with $d_i$ being a parameter.

Of course, many alternative functions will be possible without departing from the scope of this invention.

The further cost function can for example be expressed as $FC = \Sigma [|Z'_{phymod} - Z'_{rafumod}|^2$, wherein
  $Z'_{phymod}$ = a value of the modeled characteristic impedance per frequency component in accordance with the physical model based on the at least one estimated parameter;
  $Z'_{rafumod}$ = a value of the modeled characteristic impedance per frequency component in accordance with the rational function model; and
  $\Sigma$ = a summing over a number of frequency components.

Of course, many alternative functions will be possible without departing from the scope of this invention.

Figure 2:
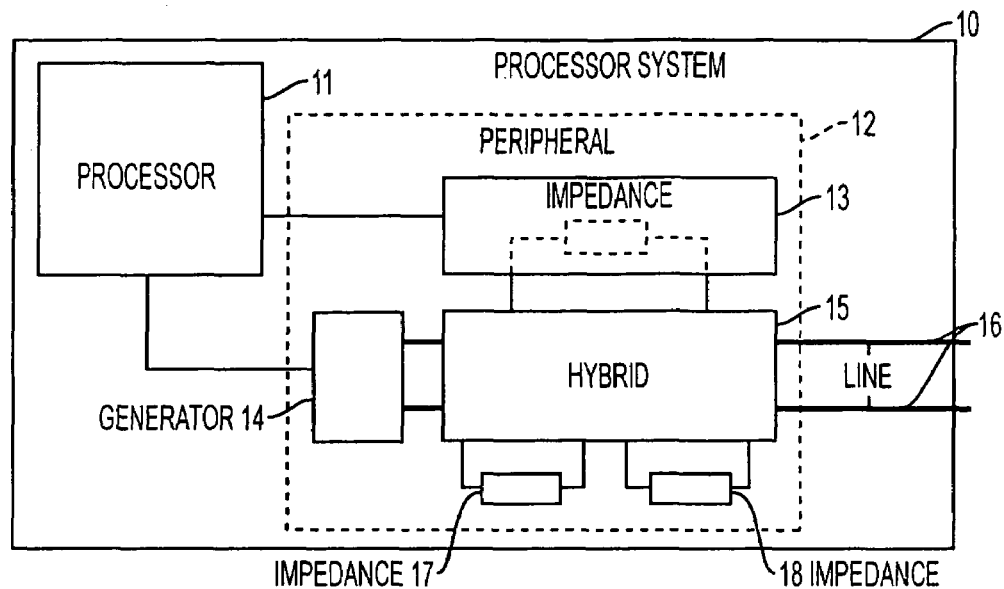
FIG. 2 shows in block diagram form a processor-system according to the invention.

The processor-system 10 according to the invention as shown in FIG. 2 comprises a processor 11 coupled to a peripheral 12. The periheral 12 comprises an impedance 13 (component bank with resistors and capacitors) coupled to a hybrid 15, which hybrid 15 is coupled to a line 16, to a generator 14 and to two impedances 17 and 18. The line 16 is further coupled to a subscriber network termination not shown. The impedances 17 and 18 indicate the measurement connections.

The impedance 13 is a prior art component bank common in the art, which through for example relais switches can combine resistors and capacitors and inductors in any arbitrary way, to create a wanted impedance, like for example a measured input impedance or a modeled and estimated characteristic impedance. Thereto, the component bank is controlled by the processor 11 in a prior art way common in the art. The generator 14, the hybrid 15, and the impedances 17 and 18 are all prior art elements common in the art. The difference between a prior art processor-system and the processor-system 10 is the value chosen for the characteristic impedance 13 of the line 16 to be realized by the component bank, and the way this value is chosen: this value is generated through modeling and estimating as described for FIG. 1, with the processor-system 10 performing method steps and/or (processor program product) functions according to the invention.

Figure 3:
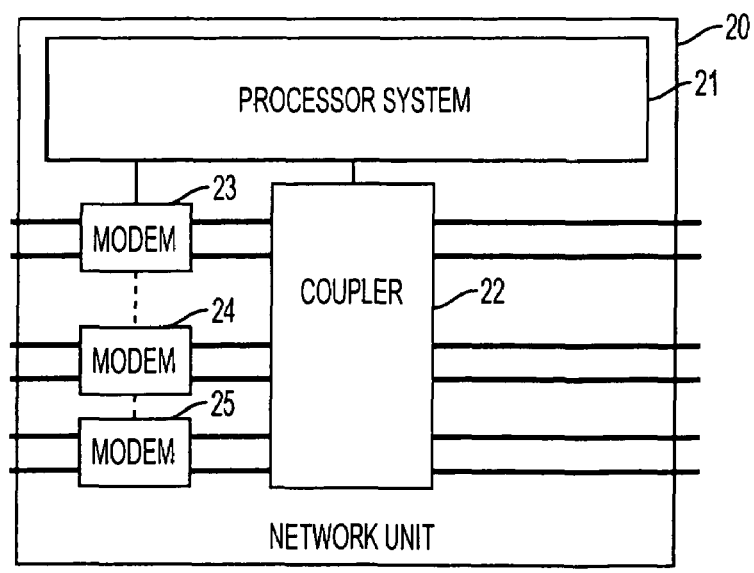
FIG. 3 shows in block diagram form a network-unit according to the invention.

The network-unit 20 according to the invention as shown in FIG. 3, like for example a Digital Subscriber Line Acces Multiplexer or a switch, a router, a bridge, a modem system etc. comprises a processor-system 21, a coupler 22, and modems 23–25 each one coupled to a subscriber line via the coupler 22. The processor-system 21 comprises parts of the processor-system 10 as shown in FIG. 2 which can be coupled to any one of the subscriber lines via the coupler 22 for measurement purposes. Alternatively, parts of the processor-system 10 as shown in FIG. 2 may be shifted into and/or integrated into the coupler 22. The minimum configuration for network-unit 20 will comprise the processor-system 21 and the sole modem 23 coupled to the subscriber line, whereby (parts of) the processor-system 21 and parts of the sole modem 23 may be integrated with each other, for example in case of the network-unit being a modem system like a modem card.

The expression "for" in for example "for matching" etc. does not exclude that other functions are performed as well, simultaneously or not. The expressions "X coupled to Y" and "a coupling between X and Y" and "coupling/couples X and Y" etc. do not exclude that an element Z is in between X and Y. The expressions "P comprises Q" and "P comprising Q" etc. do not exclude that an element R is comprises/included as well. The terms "a" and "an" do not exclude the possible presence of one or more pluralities.

The steps of measuring, modeling, estimating, converting and setting do not exclude further steps, like for example, inter alia, the steps described for FIG. 1 etc.

The invention claimed is:

1. A method for matching an adaptive hybrid (15) to a line (16) for making a reflectogram of the line (16), the method comprising:
measuring (1) an input impedance ($Z_{meas}$) of the line (16);
modeling (2) a characteristic impedance of the line (16) via a physical model ($Z_{phymod}$);
estimating (3) at least one parameter of the physical model ($Z_{phymod}$) via a cost function which depends on the measured input impedance ($Z_{meas}$);
converting (30) the modeled characteristic impedance into at least one impedance value (13); and
setting (31) the adaptive hybrid (15) with the at least one impedance value (13).

2. A method as defined in claim 1, wherein the physical model ($Z_{phymod}$) depends on a frequency s, at least one Bessel function $J_i$ and at least three parameters $a_i$ related to geometrical dimensions and material constants of the line (16).

3. A method as defined in claim 2, wherein the physical model $Z_{phymod} = [a_4 s^2 + a_1 s (-s)^{1/2} J_0/J_1 + a_1 a_3 s^2 \psi/2]^{1/2}/(a_5 s)$, wherein
$\psi = (3 a_2^3 J_3 J_2 + 2 a_2 J_1 J_2 + a_2^2 J_0 J_3)/(a_2^3 J_2 J_3 + a_2 J_1 J_2 + 3 a_2^2 J_0 J_3 + J_0 J_1)$;
$J_i = J_i [a_3(-s)^{1/2}]$;
$a_1 = A - 1 (\mu/\sigma)^{1/2} \epsilon L [\operatorname{arcosh}(D/2A)]^{-1}$;
$a_2 = (A/D)^2$;
$a_3 = A(\mu\sigma)^{1/2}$;
$a_4 = a_1 a_3 [\ln (a2)^{-1/2}]^{-1}$; and
$a_5 = \pi \epsilon L [\operatorname{arcosh}(D/2A)]^{-1}$;
with A, D and L being geometrical dimensions and with $\sigma$, $\epsilon$ and $\mu$ being material constants of the line (16).

4. A method as defined in claim 1, wherein the cost function $C = \Sigma[|Z'_{phymod} - Z'_{meas}|^2/(Z'_{est-var})^2]$, wherein
$Z'_{phymod}$ = a value of the modeled characteristic impedance per frequency component;
$Z'_{meas}$ = a value of the measured input impedance per frequency component;
$Z'_{est-var}$ = a value of an estimated variance per frequency component of the measured input impedance; and
$\Sigma$ = a summing over a number of frequency components.

5. A method as defined in claim 1, wherein the method further comprises the further steps of:
modeling (6) a characteristic impedance of the line (16) via a rational function model ($Z_{rafumod}$); and
estimating (7) at least one parameter of the rational function model ($Z_{rafumod}$) via a further cost function which depends on an outcome of the physical model ($Z_{phymod}$);
which further steps are situated between the step of estimating (3) and the step of converting (30).

6. A method as defined in claim 5, wherein the rational function model $Z_{rafumod} = (\Sigma C_i S^i)/(\Sigma d_i s^i)$, wherein
$\Sigma c_i s^i$ = a summing from i=0 to i=n with $c_i$ being a parameter; and
$\Sigma d_i s^i$ = a summing from i=0 to i=m with $d_i$ being a parameter.

7. A method as defined in claim 5, wherein the further cost function $FC = \Sigma[|Z'_{phymod} - Z'_{rafumod}|^2$, wherein
$Z'_{phymod}$ = a value of the modeled characteristic impedance per frequency component in accordance with the physical model based on the at least one estimated parameter;
$Z'_{rafumod}$ = a value of the modeled characteristic impedance per frequency component in accordance with the rational function model; and
$\Sigma$ = a summing over a number of frequency components.

8. A computer readable medium storing a control program to have a computer carry out a method to match an adaptive hybrid (15) to a line (16) for making a reflectogram of the line (16), the method comprising:
measuring (1) an input impedance ($Z_{meas}$) of the line (16);
modeling (2) a characteristic impedance of the line (16) via a physical model ($Z_{phymod}$);
estimating (3) at least one parameter of the physical model ($Z_{phymod}$) via a cost function which depends on the measured input impedance ($Z_{meas}$);
converting (30) the modeling characteristic impedance into at least one impedance value (13); and
setting (31) the adaptive hybrid (15) with the at least one impedance value (13).

9. A method as defined in claim 8, wherein the physical model $Z_{phymod}$ depends on a frequency s, at least one Bessel function $J_i$ and at least three parameters $a_i$ related to geometrical dimensions and material constants of the line (16),
the physical model $Z_{phymod} = [a_4 s^2 + a_1 s (-s)^{1/2} J_0/J_1 + a_1 a_3 s^2 \psi/2]^{1/2}/(a_5 s)$,, wherein
$\psi = (3 a_2^3 J_3 J_2 + 2 a_2 J_1 J_2 + a_2^2 J_0 J_3)/(a_2^3 J_2 J_3 + a_2 J_1 J_2 + 3 a_2^2 J_0 J_3 + J_0 J_1)$;
$J_i = J_i [a_3 (-s)^{1/2}]$;
$a_1 = A - 1 (\mu/\sigma)^{1/2} \epsilon L [\operatorname{arcosh}(D/2A)]^{-1}$;
$a_2 = (A/D)^2$;
$a_3 = A(\mu\sigma)^{1/2}$;
$a_4 = a_1 a_3 [\ln (a2)^{-1/2}]^{-1}$; and
$a_5 = \pi \epsilon L [\operatorname{arcosh}(D/2A)]^{-1}$;
with A, D and L being geometrical dimensions and with $\sigma$, $\epsilon$ and $\mu$ being material constants of the line (16).

10. A method as defined in claim 8, wherein the cost function $C = \Sigma[|Z'_{phymod} - Z'_{meas}|^2/(Z'_{est-var})^2]$, wherein
$Z'_{phymod}$ = a value of the modeled characteristic impedance per frequency component;
$Z'_{meas}$ = a value of the measured input impedance per frequency component;
$Z'_{est-var}$ = a value of an estimated variance per frequency component of the measured input impedance; and
$\Sigma$ = a summing over a number of frequency components.

11. A method as defined in claim 8, wherein the method further comprises the further steps of:
modeling (6) a characteristic impedance of the line (16) via a rational function model ($Z_{rafumod}$); and
estimating (7) at least one parameter of the rational function model ($Z_{rafumod}$) via a further cost function which depends on an outcome of the physical model ($Z_{phymod}$);
which further steps are situated between the step of estimating (3) and the step of converting (30),
wherein the rational function model $Z_{rafumod} = (\Sigma c_i s^i)/(\Sigma d_i s^i)$, $\Sigma c_i\, s^i$ = a summing from i=0 to i=n with $c_i$ being a parameter; and $\Sigma d_i\, s^i$ = a summing from i=0 to i=m with $d_i$ being a parameter.

12. A method as defined in claim 8, wherein the method further comprises the further steps of:
   modeling (6) a characteristic impedance of the line (16) via a rational function model ($Z_{rafumod}$); and
   estimating (7) at least one parameter of the rational function model ($Z_{rafumod}$) via a further cost function which depends on an outcome of the physical model ($Z_{phymod}$);
   which further steps are situated between the step of estimating (3) and the step of converting (30),
   wherein the further cost function FC=$\Sigma[|Z'_{phymod} - Z'_{rafumod}|^2$,
   $Z'_{phymod}$=a value of the modeled characteristic impedance per frequency component in accordance with the physical model based on the at least one estimated parameter;
   $Z'_{rafumod}$=a value of the modeled characteristic impedance per frequency component in accordance with the rational function model; and
   $\Sigma$=a summing over a number of frequency components.

13. A processor-system (10) for matching an adaptive hybrid (15) to a line (16) for making a reflectogram of the line (16), wherein the processor-system (10) performs the functions of
   measuring (1) an input impedance ($Z_{meas}$) of the line (16);
   modelling (2) a characteristic impedance of the line (16) via a physical model ($Z_{phymod}$);
   estimating (3) at least one parameter of the physical model ($Z_{phymod}$) via a cost function which depends on the measured input impedance ($Z_{meas}$);
   converting (30) the modelled characteristic impedance into at least one impedance value (13); and
   setting (31) the adaptive hybrid (15) with the at least one impedance value (13).

14. A network-unit (20) comprising an adaptive hybrid (15) and a processor-system (21) for matching an adaptive hybrid (15) to a line (16) for making a reflectogram of the line (16), wherein the processor-system (21) performs the functions of
   measuring (1) an input impedance ($Z_{meas}$) of the line (16);
   modelling (2) a characteristic impedance of the line (16) via a physical model ($Z_{phymod}$);
   estimating (3) at least one parameter of the physical model ($Z_{phymod}$) via a cost function which depends on the measured input impedance ($Z_{meas}$);
   converting (30) the modelled characteristic impedance into at least one impedance value (13); and
   setting (31) the adaptive hybrid (15) with the at least one impedance value (13).

* * * * *